United States Patent
Fricker (10) Patent No.: US 9,204,570 B2
(45) Date of Patent: Dec. 1, 2015

(54) LEVER MECHANISM TO FACILITATE EDGE COUPLING OF CIRCUIT BOARD

(71) Applicant: Advanced Micro Devices, Inc., Sunnyvale, CA (US)

(72) Inventor: Jean-Philippe Fricker, Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 153 days.

(21) Appl. No.: 14/147,219

(22) Filed: Jan. 3, 2014

(65) Prior Publication Data
US 2015/0195943 A1    Jul. 9, 2015

(51) Int. Cl.
*G06F 1/16* (2006.01)
*H05K 7/14* (2006.01)
*G06F 1/18* (2006.01)

(52) U.S. Cl.
CPC .............. *H05K 7/1409* (2013.01); *G06F 1/186* (2013.01); *H05K 7/1461* (2013.01); *H05K 7/1487* (2013.01)

(58) Field of Classification Search
USPC .............. 312/223.2, 249.11, 223.1, 245, 295, 312/348.4, 236, 317.1, 326; 455/569.2, 455/74.1, 418, 41.1, 575.4, 572, 573, 575.1, 455/566, 575.3, 569.1, 90.3, 563, 575.7; 345/173, 184, 156, 169, 175, 633, 684, 345/629; 248/448, 205.8; 361/679.28, 361/679.01, 679.55, 679.26, 679.31, 361/679.32, 679.09, 679.06, 679.41, 361/679.45, 679.23, 679.3, 679.43, 679.21, 361/679.48, 679.46, 679.27, 679.56, 361/679.54, 679.12, 679.08, 679.05
See application file for complete search history.

(56) References Cited

U.S. PATENT DOCUMENTS

| | | | |
|---|---|---|---|
| 6,688,614 B2* | 2/2004 | Hsu | 280/37 |
| 2012/0295667 A1* | 11/2012 | Tomasini et al. | 455/569.2 |
| 2013/0026893 A1* | 1/2013 | Chen et al. | 312/223.2 |

* cited by examiner

*Primary Examiner* — Hung Duong (57) ABSTRACT

A lever mechanism facilitates coupling of a sliding board and a connector. A sliding board is partially enclosed by a sliding board enclosure, such that the sliding board is slidable relative to the enclosure. A pair of pivot levers is disposed between the sliding board and the enclosure. Each pivot lever is connected at a proximal end to the enclosure and at a pivot point to the sliding board. A distal end of the pivot lever is removably engageable with a second circuit board. The lever mechanism translates a pushing force on the enclosure to a pulling force on the sliding board, aligning and eventually coupling the sliding board with the connector.

20 Claims, 7 Drawing Sheets

LEVER MECHANISM TO FACILITATE EDGE COUPLING OF CIRCUIT BOARD

BACKGROUND

1. Field of the Disclosure

The present disclosure relates generally to modular computing systems employing edge-coupled circuit boards and, more particularly, to the coupling of a circuit board to a backplane, motherboard, or other circuit board.

2. Description of the Related Art

Modular computing systems often rely on the connection of one or more circuit boards to a corresponding backplane, motherboard, or other circuit board. To illustrate, server systems often employ a server chassis having a backplane with slot connectors into which one or more server blades are inserted or connected, and desktop computers often employ expansion slots into which expansion cards may be inserted and connected. The conventional approach involves a technician pushing the circuit board from an edge furthest away from the connecting backplane, forcing the circuit board toward the server backplane and introducing unstable compression forces along the length of the circuit board, which can cause it to bend or crack. Further, in many implementations, the technician building, maintaining, or modifying the computing system does not have a clear view of the slot connector on the backplane or motherboard during the circuit board coupling process, and thus is required to attempt to couple a connector on the circuit board with the corresponding connector without visual cues. This frequently leads to misalignment resulting in damage to the connectors or the circuit boards themselves.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-8 illustrate example embodiments of a lever mechanism that facilitates coupling of a connector of a sliding board with a corresponding connector. For example, the lever mechanism could be used to facilitate coupling of a server blade, printed circuit board (PCB), or other sliding board with a server backplane, motherboard, PCB, other circuit board, or a floating connector terminating a cable. In the illustrated embodiments, the sliding board having the connector is at least partially enclosed by an enclosure that allows the sliding board to slide within the enclosure toward and away from a connection surface of the corresponding connector. The lever mechanism is illustrated as a pair of pivot levers, each connected at a proximal end to an interior surface of the enclosure and at a pivot point to the sliding board. The distal end of each pivot lever has an opening to receive and facilitate maintaining a fastening component attached to the corresponding connector.

When the distal end of each pivot lever is engaged with the fastening component of the corresponding connector, a pushing force exerted by a technician on the enclosure in a direction toward the connection surface of the corresponding connector causes the pivot levers to pivot about the pivot points and the fastening components of the corresponding connector. As the enclosure is pushed toward the connection surface of the corresponding connector, the rotation of the pivot levers translates the pushing force into a pulling force, pulling the sliding board by the pivot points toward the connection surface of the corresponding connector, aligning and eventually engaging the connector of the sliding board with the corresponding connector.

The pivot levers can act together as a force multiplier, such that the pushing force applied to the enclosure is less than the resulting pulling force on the sliding board, reducing the significance of the pushing force applied by a technician to couple the sliding board with the corresponding connector during installation, and thus reducing the likelihood of damage to the sliding board during the installation process. Further, the pivot levers help to avoid damage caused by compression forces along the length of the sliding board, since the technician applies the pushing force to the enclosure rather than the sliding board itself, and the sliding board is pulled by the levers rather than pushed by the technician.

Note that although the techniques described herein are described in the example context of coupling a sliding board to a corresponding connector in a chassis, and in particular the installation of a server blade with a connector of a server backplane, the disclosed techniques can be used in a variety of contexts (e.g. expansion cards). For example, components described as a "blade" in the illustrated embodiments may be any type of sliding board in other embodiments, for example a PCB, a stripboard, a substrate board and the like. Similarly, components described as a "backplane" in the illustrated embodiments may be any type of corresponding connector in other embodiments, for example a PCB, a stripboard, a motherboard, a server backplane, a floating connector terminating a cable, and the like.

Figure 1:
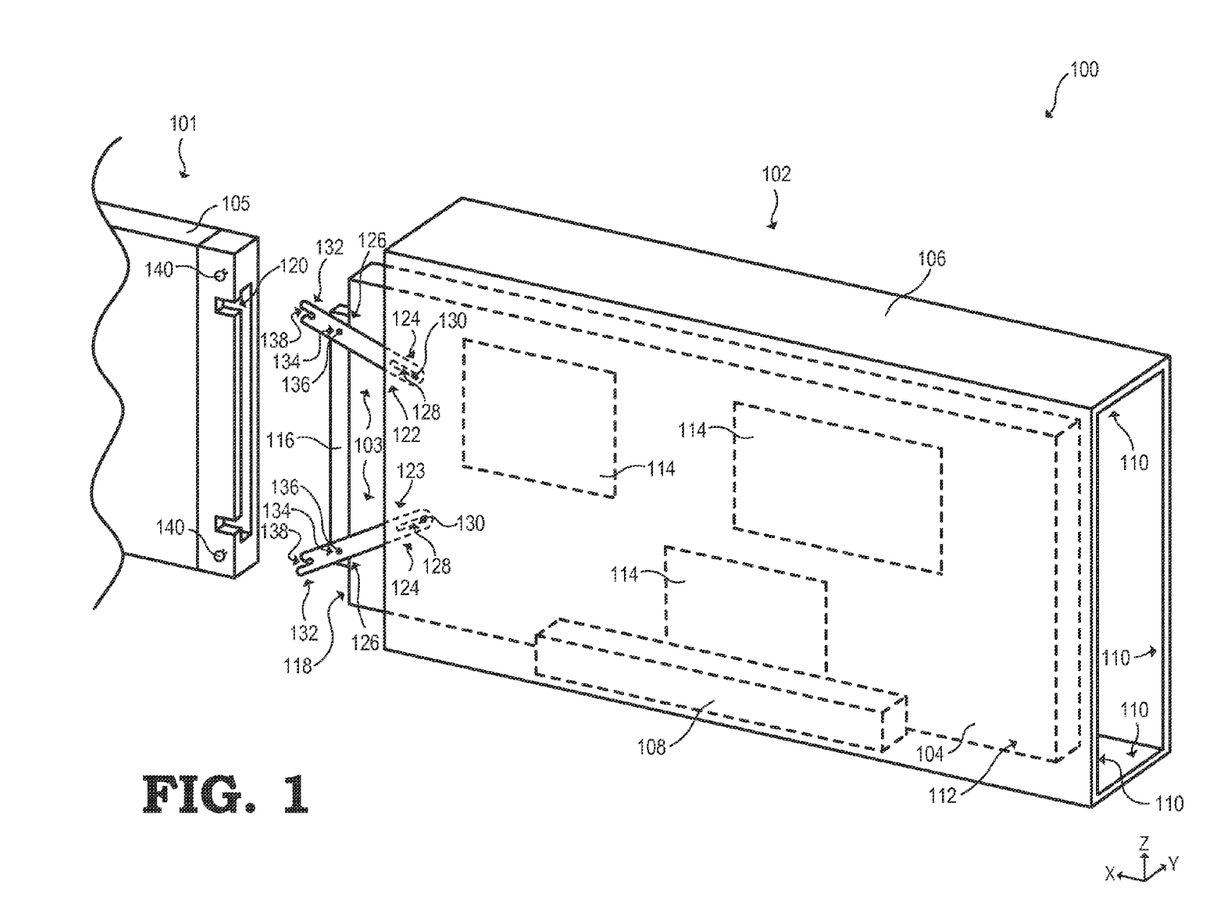
FIG. 1 is a perspective view of a of a server having a sled, a server chassis, and a lever mechanism disposed at a surface of the sled, the lever mechanism configured to engage the server chassis so as to facilitate coupling of the sled with a backplane of the server chassis in accordance with some embodiments.

FIG. 1 illustrates a perspective view of a server 100 comprising a server chassis 101 a sled 102, and a lever mechanism 103 for facilitating coupling of a blade 104 of the sled 102 with a backplane 105 of the server chassis in accordance with some embodiments. A circuit board enclosure 106 at least partially encloses the blade 104 and includes a guide 108 on an interior surface 110 of the enclosure 106 to facilitate sliding of the blade 104 along the x-axis parallel to a major surface 112 of the blade 104. In the depicted example, the guide 108 is a tab that extends along the x-axis inside the enclosure 106, however any guide 108 may be used that facilitates sliding of the blade 104 along the x-axis, for example the guide 108 may employ any combination of grooves, tabs, wheels, rails, and the like that serve to support the blade 104 in the y- and z-directions while only allowing the blade 104 to move in the x-direction. In some embodiments, the guide 108 further restricts all the rotation axes relative to the enclosure 106. The enclosure 106 and the guide 108 may be composed of any of a variety of suitable materials or combinations thereof, such as aluminum, steel, or other metals, plastic, wood, ceramic, carbon fiber, and the like. While the guide 108 is described in the example context of the server blade 104, similar principles would apply to a guide used with other types of sliding boards of other embodiments.

The blade 104 includes a set of integrated circuit packages 114 disposed at a major surface 112, and a male connector 116 disposed at a front surface 118. As depicted, the backplane 105 comprises a female slot connector 120 corresponding to the male connector 116 of the blade 104. While the blade 104 is depicted as having the male connector 116 and the backplane 105 is depicted as having the female slot connector 120, in other embodiments this arrangement may be reversed, or different types of compatible connectors may be used as long as the connector of the blade 104 corresponds to the connector of the backplane 105.

The lever mechanism 103, as depicted, includes a pair of pivot levers 122, 123, connected at a proximal end 124 to the interior 110 of the enclosure 106 and at a pivot point 126 to the blade 104. The proximal end 124 of each pivot lever 122, 123 comprises a slot 128 that receives a fastening component 130 that extends away from the interior 110 of the enclosure 106 and acts as an axis for the pivot lever 122, 123, allowing the pivot lever 122, 123 to rotate about the fastening component 130 as well as slide the length of the slot 128. The pivot point 126 is depicted at a point closer to a distal end 132 of the pivot lever 122, 123 than the proximal end 124 of the lever such that when the pivot lever 122, 123 pivots about the pivot point 126, the proximal end 124 travels a greater distance than the distal end 132 in accordance with some embodiments. The pivot point 126 comprises a hole 134 that receives a fastening component 136 attached to the male connector 116 of the blade 104, such that the pivot lever 122, 123 is rotatable about the fastening component 136. In other embodiments the fastening component 136 may be attached anywhere on the blade 104. The distal end 132 of the pivot lever 122, 123 comprises an opening 138 to receive a fastening component 140 attached to the backplane 105. The fastening components 130, 136, 140 each may comprise, for example, a screw, a pin, a bolt, a hook, or a combination thereof. Further, in different embodiments, the slot 128, the hole 134, and the opening 138 may each comprise a different shape or relative size than those depicted so as to accommodate a given fastening component 130, 136, 140 while still permitting the necessary movement of the pivot lever 122, 123. In some embodiments, the location of the slot 128, the hole 134, the opening 138 and their respective fastening components 130, 136, 140 could be inverted in all their instances. One embodiment of the slot 128, the hole 134, the opening 138, and the fastening components 130, 136, 140 are described in greater detail below with reference to the cross-section view of FIG. 8.

The pivot levers 122, 123 are illustrated in an "open" position to facilitate receiving the fastening components 140 of the server chassis 101. In some embodiments a spring, other biased device, a stop, and the like could be disposed between the pivot levers 122, 123, between each pivot lever 122, 123 and the enclosure 106, or between the blade 104 and the enclosure 106 to facilitate maintaining an appropriate "open" position before engagement with the server chassis 101 to align with and receive the fastening components 140.

Figure 2:
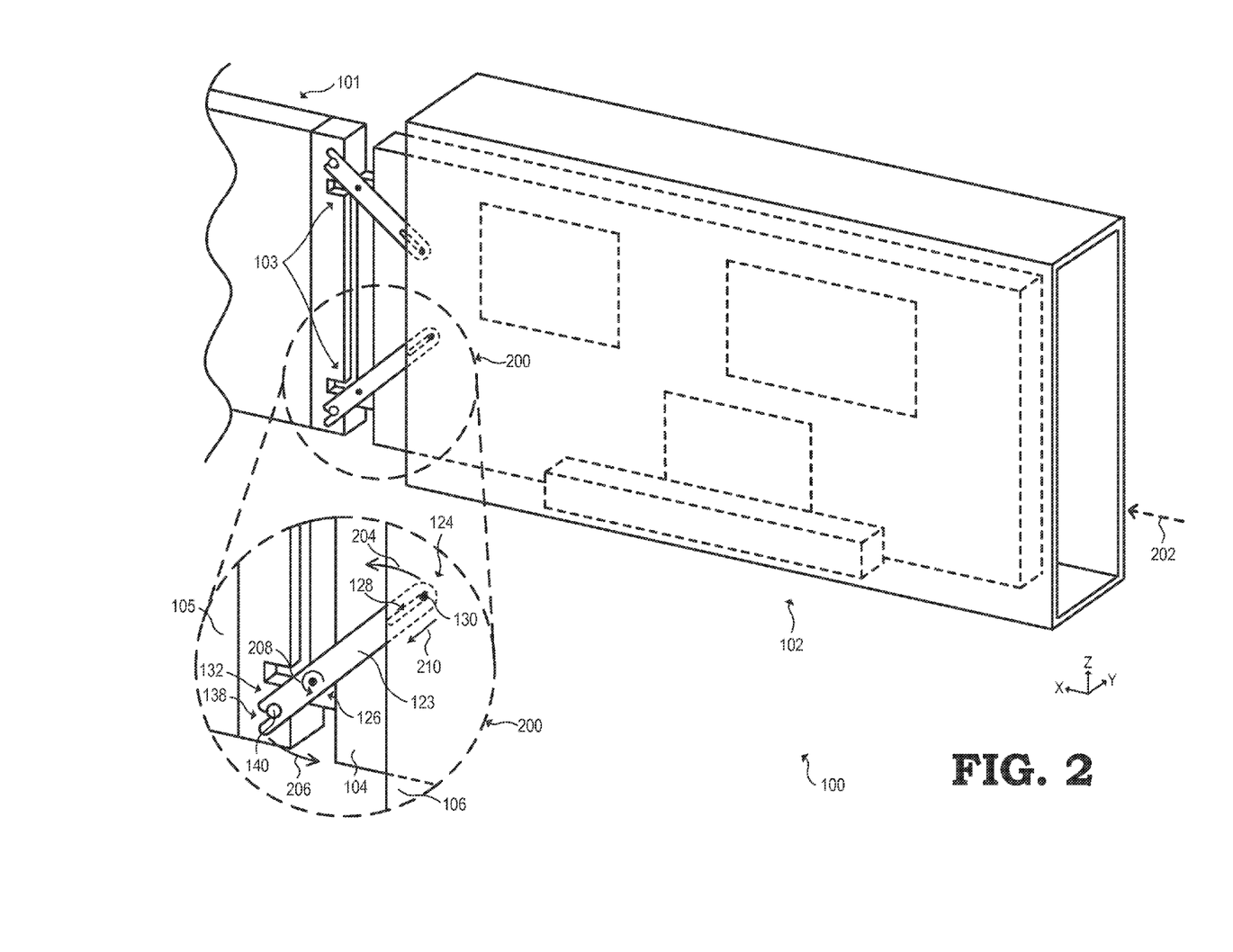
FIG. 2 is perspective view of the server of FIG. 1 after the lever mechanism has engaged the server chassis and a detail view of the motion available to the lever mechanism in accordance with some embodiments.
Figure 3:
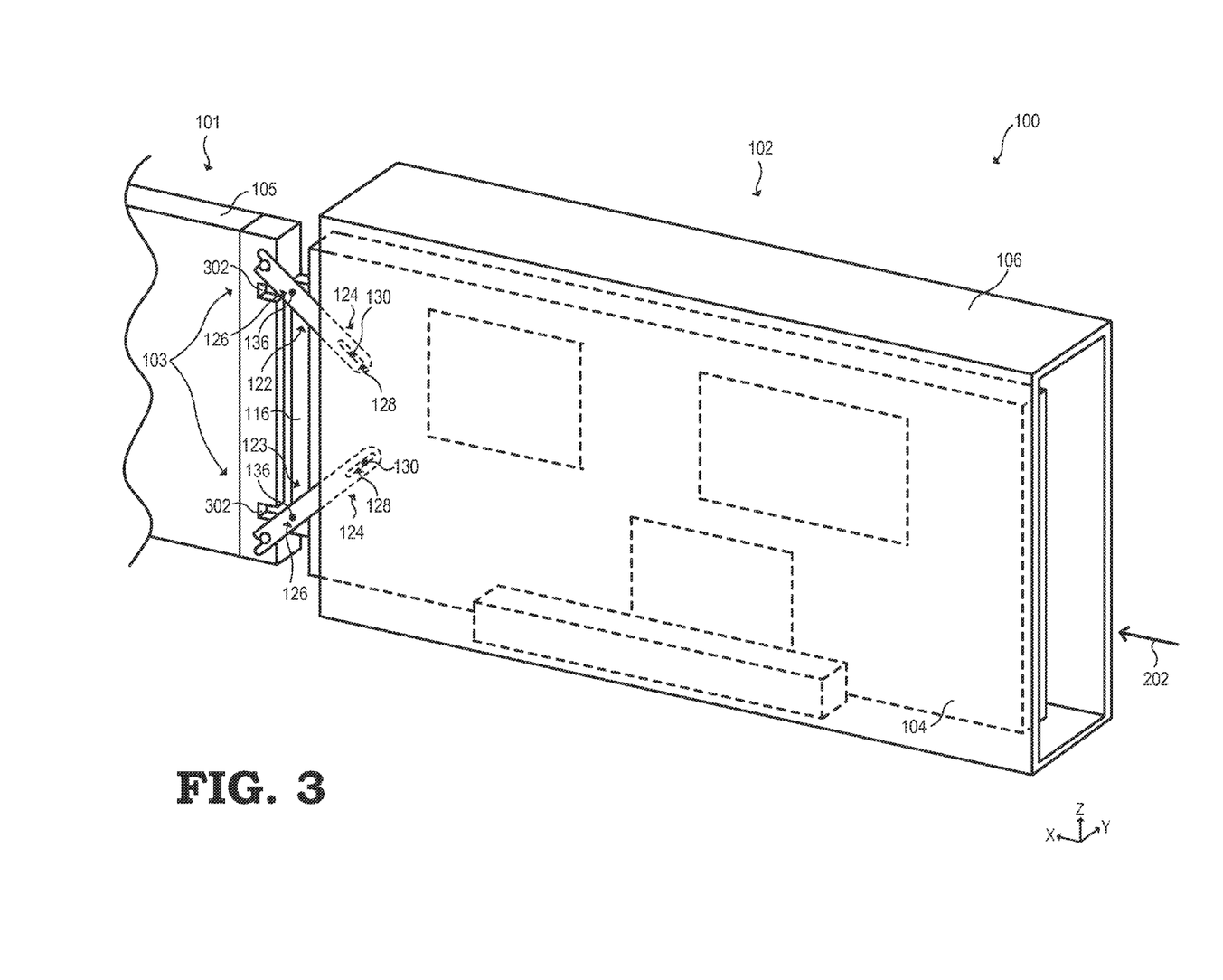
FIG. 3 is a perspective view of the server of FIG. 1 after a pushing force has been applied to the sled, specifically to a circuit board enclosure that partially encloses a blade, causing the enclosure to move relative to the blade in accordance with some embodiments.
Figure 4:
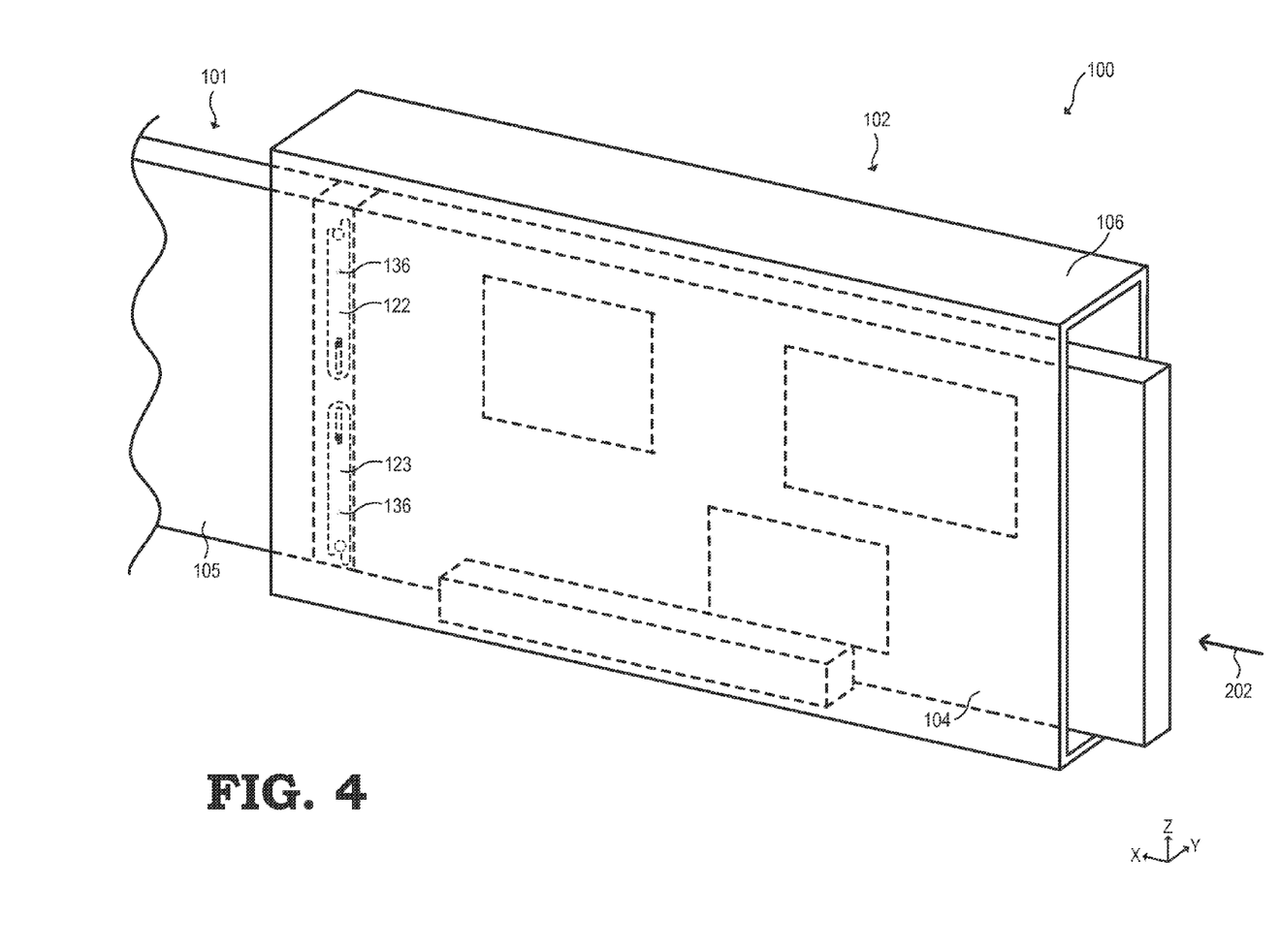
FIG. 4 is a perspective view of the server of FIG. 1 after the lever mechanism has translated the pushing force on the enclosure to a pulling force on the blade, electrically and mechanically coupling the sled with the backplane in accordance with some embodiments.

FIGS. 2-4 sequentially illustrate example operation of the lever mechanism 103 as a pushing force is applied by a technician to the enclosure 106 toward the female slot connector 120 during an installation process.

FIG. 2 is a perspective view of the server 100 of FIG. 1 after the lever mechanism 103 has engaged the backplane 105 and a detail view 200 of the motion available to pivot lever 123 in accordance with some embodiments. As can be seen in detail view 200, the opening 138 at the distal end 132 of the pivot lever 123 has received the fastening component 140. As a pushing force 202 is applied to the enclosure 106, the enclosure 106 moves along the x-axis toward the female slot connector 120, and the fastening component 130, causing the proximal end 124 of the pivot lever 123 to move in direction 204, the distal end 132 to move in direction 206, and the pivot lever 123 to rotate about the pivot point 126 in direction 208 and to move along an axis created by the slot 128 in direction 210. This results in a travel motion of the blade 104 and the enclosure 106 toward the server chassis 101, while the blade 104 travels more slowly than the enclosure 106 by a ratio equal to the ratio of the distance between the fastening component 130 at the distal end 132 of the lever 122, 123 and the pivot point 126, and the distance between the fastening component 130 at the distal end 132 and the fastening component 140 at the proximal end 124. For example, in some embodiments, the distance between the fastening component 130 at the distal end 132 and the fastening component 140 at the proximal end 124 may be approximately three times greater than the distance between the fastening component 130 at the distal end 132 and the pivot point 126, resulting in a pulling force on the blade 104 that is approximately three times greater than the pushing force 202 on the enclosure 106. The other pivot lever 122, of the pair of pivot levers 122, 123 would move in a similar fashion with rotation in the opposite direction. It is also understood a force applied in the opposite direction of the pushing force 202 would move the enclosure 106 along the x-axis in the opposite direction, causing the pivot levers 122, 123 to move in the opposite direction of directions 204, 206, 208, 210.

FIG. 3 illustrates a perspective view of the server 100 of FIG. 1 after the pushing force 202 has been applied to the enclosure 106 in accordance with some embodiments. The enclosure 106 has moved in the x-direction relative to the blade 104, such that the enclosure 106 is now noticeably closer to the female slot connector 120 than it was in FIG. 2, while the blade 104 has barely moved relative to the female slot connector 120. The pivot levers 122, 123 have each rotated about the pivot point 126, and moved along the axis created by slot 128 such that the fastening component 130 is further from the proximal end 124 than it was in FIG. 2. The backplane 105 comprises cutouts 302 to receive fastening components 136 as the lever mechanism 103 moves toward the backplane 105. In other embodiments, cutouts 302 may be of different shape and size, or may not be included at all.

FIG. 4 illustrates a perspective view of the server 100 of FIG. 1 after the lever mechanism 103 has translated the pushing force 202 on the enclosure 106 to a pulling force on the blade 104, coupling the backplane 105 with the blade 104 in accordance with some embodiments. The pushing force 202 causes the enclosure 106 to move further toward the female slot connector 120 (FIG. 1), further rotating the pivot levers 122, 123 about pivot point 126, until the pivot levers 122, 123 pull the blade 104 by the fastening component 136 at the pivot point 126 toward the female slot connector 120. The controlled movement of the lever mechanism 103 facilitates alignment as the blade 104 and the male connector 116 (FIG. 1) are pulled toward the female slot connector 120 until the male connector 116 engages the female slot connector 120, electrically and mechanically coupling the blade 104 to the backplane 105. As depicted, the pivot levers 122, 123 have rotated into a position such that they share an axis along their lengths once the blade 104 is coupled to the backplane 105, however in other embodiments the pivot levers 122, 123 may end rotation before or after the depicted position. The enclosure 106 is depicted as extending over the backplane 105, but in other embodiments the circuit board enclosure may extend any amount over the backplane 105, or not at all.

Figure 5:
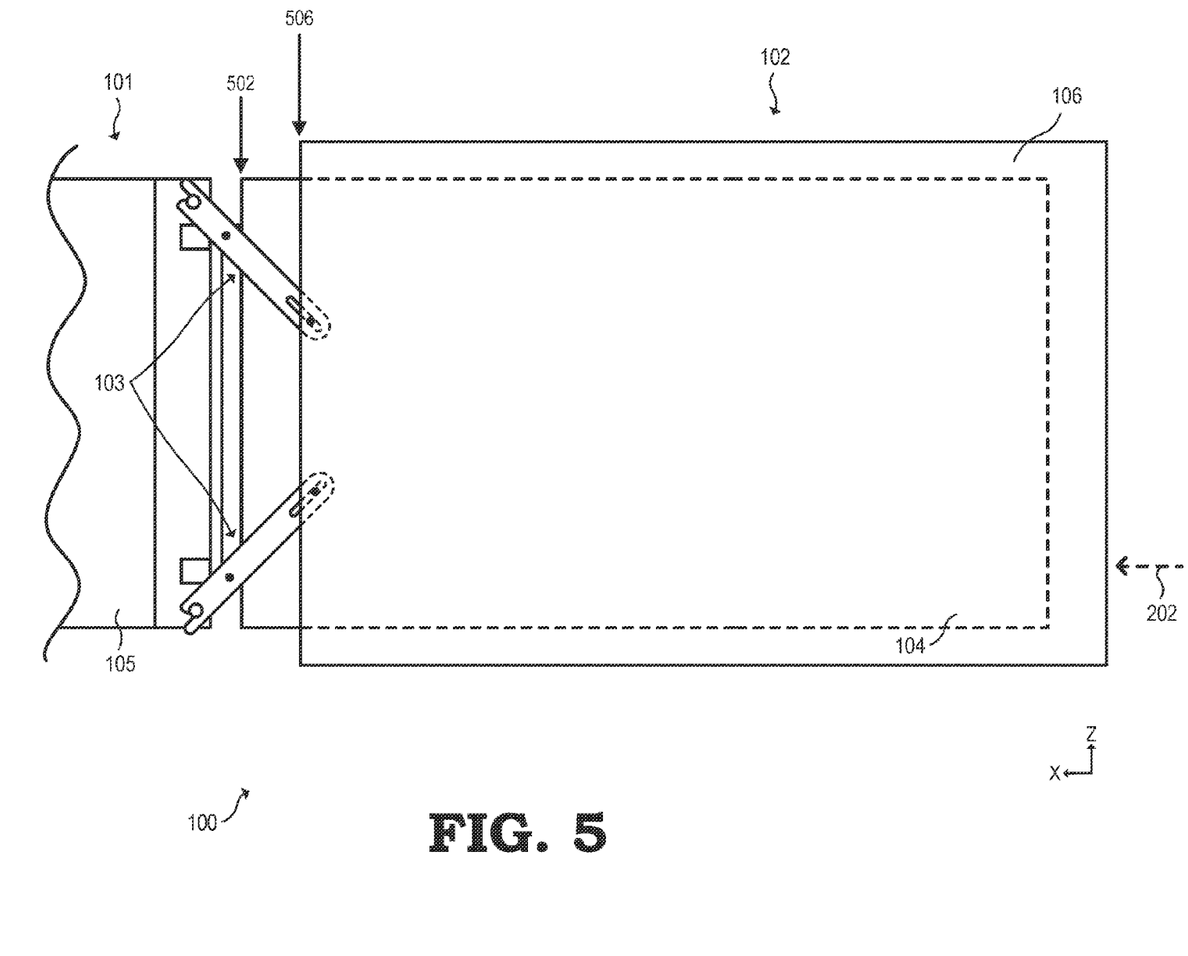
FIG. 5 is a side view of the server of FIG. 1 after the lever mechanism has engaged the circuit board in accordance with some embodiments.
Figure 6:
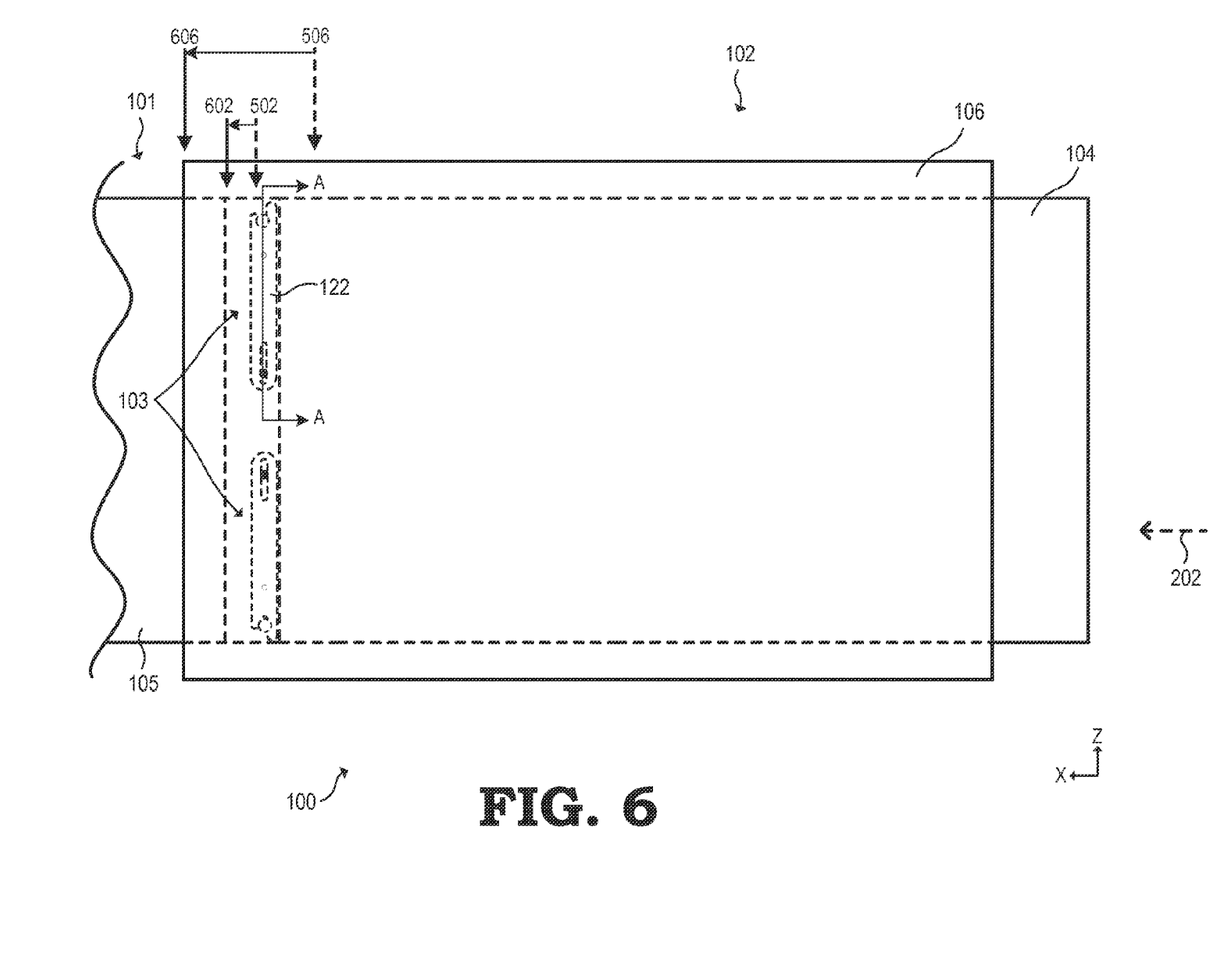
FIG. 6 is a side view of the server of FIG. 1 after the lever mechanism has translated the pushing force on the enclosure to the pulling force on the blade, electrically and mechanically coupling the sled with the backplane in accordance with some embodiments.

FIGS. 5 and 6 are side views of the server 100 that together illustrate the engagement process described above. FIG. 5 illustrates a side view of the server 100 of FIG. 1 after the lever mechanism 103 has engaged the backplane 105, but before the pushing force 202 is applied in accordance with some embodiments. At this point, the blade 104 and the enclosure 106 are at first positions 502 and 506, respectively. FIG. 6 is a side view of the server 100 of FIG. 1 after the lever mechanism 103 has translated the pushing force 202 on the enclosure 106 to a pulling force on the blade 104, coupling the circuit board with the blade in accordance with some embodiments. The blade 104 and the enclosure 106 are at second positions 602 and 606, respectively. As is illustrated, the lever mechanism 103 acts as a force multiplier, such that the pushing force 202 applied to the enclosure 106 is translated to a pulling force on the blade 104 that is greater than the pushing force 202, thereby reducing the significance of the pushing force applied by a technician to couple the blade 104 with the backplane 105 during installation, and thus reducing the likelihood of damage to the blade 104, the backplane 105, the male connector 116, or the female slot connector 120 during the installation process. Further, the lever mechanism 103 helps to avoid damage caused by compression forces along the length of the blade 104, since the technician applies the pushing force 202 to the enclosure 106 rather than the blade 104 itself, and the blade 104 is pulled by the lever mechanism 103 rather than pushed by the technician. Lever 122 is depicted with cutline A-A, the cross-section of which is described in detail below with reference to FIG. 8.

Figure 7:
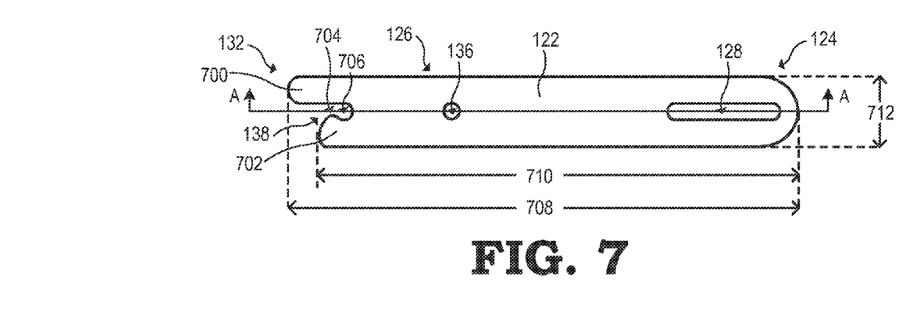
FIG. 7 is a top view of a pivot lever of the lever mechanism of FIG. 1 in accordance with some embodiments.

FIG. 7 is a top view of one of pivot lever 122 of the lever mechanism 103 of FIG. 1 in accordance with some embodiments. The pivot lever 122 comprises the slot 128 at the proximal end 124, the hole 134 at the pivot point 126, and the opening 138 at the distal end 132 as described above. A first arm 700 and a second arm 702 define the opening 138, a throat 704, and a hole 706. The distance 708 from the proximal end 124 of the pivot lever 122 to the distal end 132 of the first arm 700 is greater than the distance 710 from the proximal end 124 of the pivot lever 122 to the distal end 132 of the second arm 702. The difference in length between the first arm 700 and the second arm 702 allows the opening 138 to act as a gathering surface for the fastening component 140 (FIG. 1), leading the fastening component 140 into the throat 704 and eventually the hole 706. The throat 704 has a width that is less than the diameter of the hole 706, so as to facilitate maintaining the fastening component 140 seated in the hole 706, reducing the likelihood of the pivot lever 122 unintentionally disengaging the fastening component 140. While the pivot lever 122 is illustrated as having a constant width 712, in some embodiments the width may vary at any point of the pivot lever 122. Cutline A-A provides reference for the cross-section illustrated in FIG. 8 as it relates to the pivot lever 122.

Figure 8:
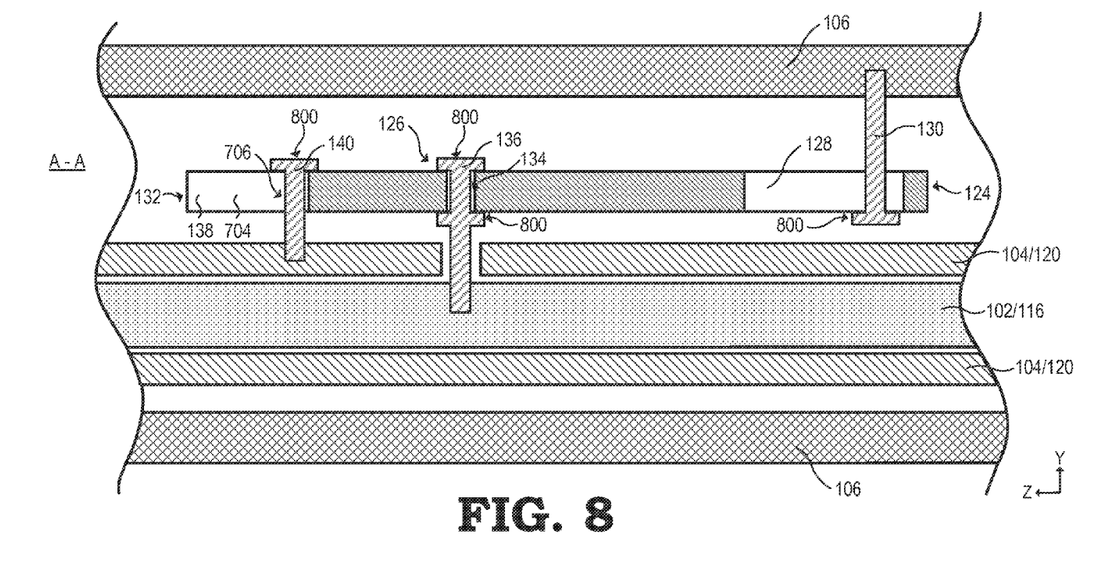
FIG. 8 is a cross-section view of the lever mechanism, backplane, and sled of FIG. 6 in accordance with some embodiments.

FIG. 8 is a cross-section view along cutline A-A of the lever mechanism 103 (specifically the pivot lever 122 as depicted in FIG. 7), the female slot connector 120 attached to the backplane 105, the male connector 116 attached to the blade 104, and the enclosure 106 of FIG. 6 in accordance with some embodiments. The male connector 116 is shown inserted into the female slot connector 120. As depicted, the fastening component 130 is connected to the proximal end 124 of the pivot lever via the slot 128; the fastening component 136 is connected to the pivot point 126 via the hole 134; and the fastening component 140 is connected to the distal end 132 via the hole 706. Also shown at the distal end 132 are the opening 138 and the throat 704. Each of the fastening components 130, 136, 140 is shown comprising at least one head 800 to facilitate maintaining the connection with the pivot lever 122 and/or to support the pivot lever 122.

While the illustrated embodiments depict the lever mechanism 103 as a pair of pivot levers 122, 123, different embodiments may implement any of a variety of lever mechanisms 103. For example, a single pivot lever 122, 123 could be used with a support to facilitate keeping the blade 104 in alignment, or one pivot lever 122, 123 on each major surface of the blade 104, or a pair of pivot levers 122, 123 on each major surface of the blade 104.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An electronic device comprising:
   a sliding board;
   a sliding board enclosure at least partially enclosing the sliding board such that the sliding board is slidable relative to the sliding board enclosure along a plane parallel to a major surface of the sliding board; and
   a lever mechanism to translate a pushing force on the sliding board enclosure to a pulling force on the sliding board so as to pull the sliding board into engagement with a connector.

2. The electronic device of claim 1, wherein the pushing force is less than the pulling force.

3. The electronic device of claim 1, further comprising:
   an opening disposed at a distal end of the lever mechanism, the opening to removably engage the connector, to align the sliding board and the connector.

4. The electronic device of claim 1, wherein the sliding board comprises a first circuit board and the connector comprises a connector of a second circuit board.

5. The electronic device of claim 4, wherein the first circuit board comprises one of a server blade and an expansion card.

6. An electronic device comprising:
   a sliding board comprising a connector disposed at an edge of the sliding board;
   a sliding board enclosure at least partially enclosing the sliding board, the sliding board slidable relative to the sliding board enclosure along a plane parallel to a first major surface of the sliding board; and
   a pair of pivot levers disposed between the first major surface of the sliding board and a first interior surface of the sliding board enclosure facing the first major surface, each pivot lever of the pair of pivot levers comprising:
      a proximal end connected to the first interior surface of the sliding board enclosure;
      a pivot point rotatably connected to the sliding board; and
      a distal end removably engageable with a corresponding connector.

7. The electronic device of claim 6, further comprising:
   a second pair of pivot levers disposed between a second major surface of the sliding board and a second interior surface of the enclosure facing the second major surface, the second major surface opposing the first major surface.

8. The electronic device of claim 6, further comprising:
   a fastening component attached to the sliding board enclosure; and
   a slot disposed at the proximal end of each pivot lever of the pair of pivot levers, the slot receiving a fastening component.

9. The electronic device of claim 6, further comprising:
   a fastening component attached to the sliding board; and
   a hole disposed at the pivot point of each pivot lever of the pair of pivot levers, the hole receiving the fastening component, the pivot lever being rotatable about the fastening component.

10. The electronic device of claim 6, further comprising:
    an opening disposed at the distal end of each pivot lever of the pair of pivot levers, the opening to engage a fastening component attached to the corresponding connector.

11. The electronic device of claim 6, further comprising:
    a throat disposed at the distal end of each pivot lever of the pair of pivot levers;
    an opening forming a first end of the throat; and
    a hole forming a second end of the throat, the throat having a width less than the diameter of the hole.

12. The electronic device of claim 6, further comprising:
    a guide disposed at an interior surface of the sliding board enclosure to facilitate sliding of the sliding board.

13. The electronic device of claim 6, wherein the pivot point is connected to a surface of the connector of the sliding board.

14. The electronic device of claim 6, wherein the sliding board comprises a first circuit board and the corresponding connector comprises a connector of a second circuit board.

15. The electronic device of claim 14, wherein the first circuit board comprises one of a server blade and an expansion card.

16. An electronic device comprising:
    a server chassis comprising a plurality of first connectors; and
    a plurality of server sleds, each server sled comprising:
       a sliding board having a second connector compatible with the first connector;
       a sliding board enclosure at least partially enclosing the sliding board, the sliding board slidable relative to the sliding board enclosure along a plane parallel to a first major surface of the sliding board; and
       at least one pivot lever disposed between the sliding board and the sliding board enclosure, the at least one pivot lever comprising:
          a proximal end connected to the sliding board enclosure;
          a pivot point rotatably connected to the sliding board; and
          a distal end removably engaged with the first connector of the server chassis.

17. The electronic device of claim 16, further comprising:
    a fastening component attached to the sliding board enclosure; and
    a slot disposed at the proximal end of the at least one pivot lever that receives the fastening component.

18. The electronic device of claim 17, wherein the fastening component comprises at least one of: a screw, a bolt, a pin, and a hook.

19. The electronic device of claim 16, further comprising:
    a fastening component attached to the sliding board; and
    a hole disposed at the pivot point of the at least one pivot lever that receives the fastening component such that the pivot lever can rotate about the fastening component.

20. The electronic device of claim 16, further comprising:
    a fastening component attached to the first connector of the server chassis; and
    an opening disposed at the distal end of the at least one pivot lever that engages the fastening component.

* * * * *